US012709795B2

(12) United States Patent
Li et al.

(10) Patent No.: US 12,709,795 B2
(45) Date of Patent: Aug. 18, 2026

(54) SUBSTRATE PROCESSING METHOD

(71) Applicant: Tokyo Electron Limited, Tokyo (JP)

(72) Inventors: Hu Li, Nirasaki City (JP); Takeo Nakano, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 157 days.

(21) Appl. No.: 18/684,223

(22) PCT Filed: Aug. 12, 2022

(86) PCT No.: PCT/JP2022/030796

§ 371 (c)(1),
(2) Date: Sep. 13, 2024

(87) PCT Pub. No.: WO2023/022112

PCT Pub. Date: Feb. 23, 2023

(65) Prior Publication Data

US 2025/0003059 A1 Jan. 2, 2025

(30) Foreign Application Priority Data

Aug. 19, 2021 (JP) ................................. 2021-134266

(51) Int. Cl.
*C23C 16/04* (2006.01)
*C23C 16/52* (2006.01)

(52) U.S. Cl.
CPC ............ *C23C 16/045* (2013.01); *C23C 16/52* (2013.01)

(58) Field of Classification Search
None
See application file for complete search history.

(56) References Cited

U.S. PATENT DOCUMENTS

2007/0111470 A1 5/2007 Smythe, III et al.
2015/0118862 A1 4/2015 Reilly et al.

FOREIGN PATENT DOCUMENTS

JP 2000-100926 A 4/2000
JP 2014-112668 A 6/2014

*Primary Examiner* — Joshua L Allen
*Assistant Examiner* — Bradford M Gates
(74) *Attorney, Agent, or Firm* — Armstrong Teasdale LLP

(57) ABSTRACT

A substrate processing method of forming a film on a substrate that contains a bond between a first element and a second element and has a recess, the substrate processing method includes: preparing the substrate; modifying a surface in the recess by generating an active species of a first processing gas and exposing the substrate to the active species; and forming a flowable film in the recess. A ratio of the first element to the second element in the surface in the recess after the modifying the surface in the recess is higher than a ratio of the first element to the second element on the surface in the recess before the modifying the surface in the recess.

14 Claims, 8 Drawing Sheets

SUBSTRATE PROCESSING METHOD

CROSS-REFERENCE TO RELATED APPLICATIONS

The present application is a U.S. National Stage Entry of International Patent Application No. PCT/JP2022/0030796, filed Aug. 12, 2022, which claims the benefit of priority to Japanese Patent Application No. 2021-134266, filed Aug. 19, 2021, each of which is hereby incorporated herein by reference in its entirety.

TECHNICAL FIELD

The present disclosure relates to a substrate processing method.

BACKGROUND

Patent Document 1 discloses a method of conformally depositing a dielectric oxide within a gap having a high-aspect-ratio in a substrate.

PRIOR ART DOCUMENTS

Patent Documents

Patent Document 1: Japanese laid-open publication No. 2014-112668

One aspect of the present disclosure provides a substrate processing method of forming a film in a recess of a substrate while preventing the generation of voids.

SUMMARY

According to one aspect of the present disclosure, there is provided a substrate processing method of forming a film on a substrate that contains a bond between a first element and a second element and has a recess, the method including preparing the substrate, modifying a surface in the recess by generating an active species of a first processing gas and exposing the substrate to the active species, and forming a flowable film in the recess, wherein a ratio of the first element to the second element in the surface in the recess after the modifying the surface in the recess is higher than a ratio of the first element to the second element on the surface in the recess before the modifying the surface in the recess.

According to one aspect of the present disclosure, it is possible to provide a substrate processing method of forming a film in a recess of a substrate while preventing the generation of voids.

DETAILED DESCRIPTION

Figure 1:
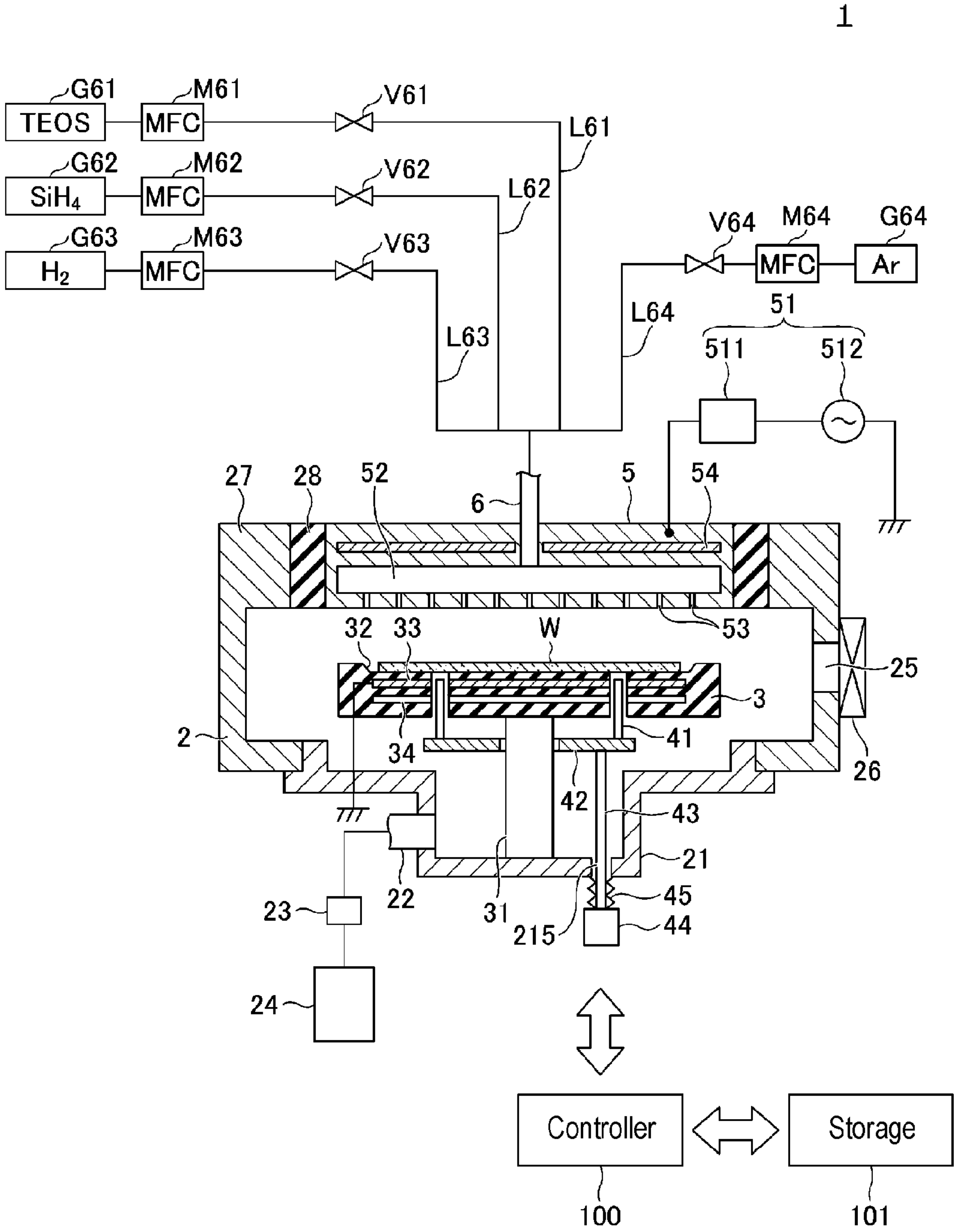
FIG. 1 is an example cross-sectional view illustrating a film forming apparatus according to an embodiment of the present disclosure.

Hereinafter, embodiments of the present disclosure will be described with reference to the accompanying drawings. In addition, in each drawing, the same reference numerals will be given to the same or corresponding components, and descriptions thereof may be omitted.

<Film Forming Apparatus>

First, a substrate processing apparatus 1 according to an embodiment of the present disclosure will be described with reference to FIG. 1. FIG. 1 is an example cross-sectional view illustrating the substrate processing apparatus 1 according to the embodiment of the present disclosure.

The substrate processing apparatus 1 includes a substantially cylindrical airtight processing container 2. An exhaust chamber 21 is provided in a central portion of a bottom wall of the processing container 2. The exhaust chamber 21 has, for example, a substantially cylindrical shape protruding downward. An exhaust pipe 22 is connected to the exhaust chamber 21, for example, to a lateral surface of the exhaust chamber 21.

An exhauster 24 is connected to the exhaust pipe 22 via a pressure adjuster 23. The pressure adjuster 23 includes, for example, a pressure adjustment valve such as a butterfly valve. The exhaust pipe 22 is configured such that the exhauster 24 is capable of depressurizing the interior of the processing container 2. A transfer port 25 is provided on a lateral surface of the processing container 2. The transfer port 25 is opened and closed by a gate valve 26. A substrate W is loaded and unloaded between the interior of the processing container 2 and a transfer chamber (not illustrated) through the transfer port 25.

A stage 3 is provided inside the processing container 2. The stage 3 is a holder that holds the substrate W in a horizontal posture with a surface of the substrate W facing upward. The stage 3 is formed in a substantially circular shape in plan view and is supported by a supporting member 31. A substantially circular recess 32 for placing the substrate W having a diameter of 300 mm, for example, is formed on a surface of the stage 3. The recess 32 has an inner diameter slightly larger than the diameter of the substrate W. The recess 32 is configured, for example, to have substantially the same depth as the thickness of the substrate W. The stage 3 is made of a ceramic material such as aluminum nitride (AlN), for example. Further, the stage 3 may be made of a metallic material such as nickel (Ni). In addition, instead of the recess 32, a guide ring for guiding the substrate W may be provided on the periphery of the surface of the stage 3.

For example, a grounded lower electrode 33 is embedded in the stage 3. A heater 34 is embedded below the lower electrode 33. The heater 34 heats the substrate W placed on the stage 3 to a set temperature upon receiving power supplied from a power supply (not illustrated) based on a control signal from a controller 100. When the entire stage 3 is made of a metal, the lower electrode 33 needs not to be buried in the stage 3 since the entire stage 3 functions as a lower electrode. Further, the lower electrode 33 may be connected to an RF power supply via a matcher in order to apply a bias. The stage 3 is provided with a plurality of (e.g., three) lifting pins 41 for holding and vertically moving the substrate W placed on the stage 3. A material of the lifting pins 41 may be, for example, ceramics such as alumina ($Al_2O_3$) or quartz. The lifting pins 41 are attached at lower ends thereof to a supporting plate 42. The supporting plate 42 is connected to a lifting mechanism 44 provided outside the processing container 2 via a lifting shaft 43.

The lifting mechanism 44 is attached, for example, to the bottom of the exhaust chamber 21. A bellows 45 is interposed between the lifting mechanism 44 and an opening 215 for the lifting shaft 43 formed in the bottom surface of the exhaust chamber 21. The shape of the supporting plate 42 may allow the supporting plate 42 to vertically move without interfering with the supporting member 31 of the stage 3. The lifting pins 41 are configured to be vertically moved between above the surface of the stage 3 and below the surface of the stage 3 by the lifting mechanism 44.

A gas supplier 5 is provided on a ceiling wall 27 of the processing container 2 via an insulating member 28. The gas supplier 5 forms an upper electrode and is opposite to the lower electrode 33. A radio frequency power supply 512 is connected to the gas supplier 5 via a matcher 511. When supplying radio frequency power in the range of 450 kHz to 1 GHz, for example, from the radio frequency power supply 512 to the upper electrode (gas supplier 5), a radio frequency electric field is created between the upper electrode (gas supplier 5) and the lower electrode 33, resulting in the generation of a capacitively coupled plasma. A plasma generator 51 includes the matcher 511 and the radio frequency power supply 512. In addition, the plasma generator 51 is not limited to the capacitively coupled plasma, but may also generate other types of plasma such as inductively coupled plasma.

The gas supplier 5 includes a hollow gas supply chamber 52. A large number of holes 53 for dispersing and supplying a processing gas into the processing container 2 are evenly arranged, for example, in a bottom surface of the gas supply chamber 52. A heater 54 is embedded above, for example, the gas supply chamber 52 in the gas suppler 5. The heater 54 is heated to a set temperature upon receiving power from a power supply (not illustrated) based on a control signal from the controller 100.

A gas supply path 6 is provided in the gas supply chamber 52. The gas supply path 6 communicates with the gas supply chamber 52. The gas supply path 6 is connected at the upstream side thereof to gas sources G61, G62, G63 and G64 through gas lines L61, L62, L63 and L64, respectively.

The gas source G61 is a TEOS (tetraethoxysilane, $Si(OC_2H_5)_4$) gas source and is connected to the gas supply path 6 through the gas line L61. The gas line L61 is provided with a mass flow controller M61 and a valve V61 in this order from the gas source G61. The mass flow controller M61 controls the flow rate of a TEOS gas flowing through the gas line L61. The valve V61 supplies and stops the TEOS gas to the gas supply path 6 by the opening and closing operations.

The gas source G62 is a $SiH_4$ gas source and is connected to the gas supply path 6 through the gas line L62. The gas line L62 is provided with a mass flow controller M62 and a valve V62 in this order from the gas source G62. The mass flow controller M62 controls the flow rate of a $SiH_4$ gas flowing through the gas line L62. The valve V62 supplies and stops the $SiH_4$ gas to the gas supply path 6 by the opening and closing operations.

The gas source G63 is a $H_2$ gas source and is connected to the gas supply path 6 through the gas line L63. The gas line L63 is provided with a mass flow controller M63 and a valve V63 in this order from the gas source G63. The mass flow controller M63 controls the flow rate of a $H_2$ gas flowing through the gas line L63. The valve V63 supplies and stops the $H_2$ gas to the gas supply path 6 by the opening and closing operations.

The gas source G64 is an Ar gas source and is connected to the gas supply path 6 through the gas line L64. The gas line L64 is provided with a mass flow controller M64 and a valve V64 in this order from the gas source G64. The mass flow controller M64 controls the flow rate of an Ar gas flowing through the gas line L64. The valve V64 supplies and stops the Ar gas to the gas supply path 6 through by opening and closing operations.

The substrate processing apparatus 1 includes the controller 100 and a storage 101. The controller 100 includes a CPU, RAM, ROM, and others (none of which are illustrated), and comprehensively controls the substrate processing apparatus 1 by causing the CPU to execute a computer program stored in the ROM or the storage 101, for example. Specifically, the controller 100 causes the CPU to execute the control program stored in the storage 101 to control the operation of each component of the substrate processing apparatus 1, thereby executing, e.g., a film formation processing on the substrate W.

Figure 2:
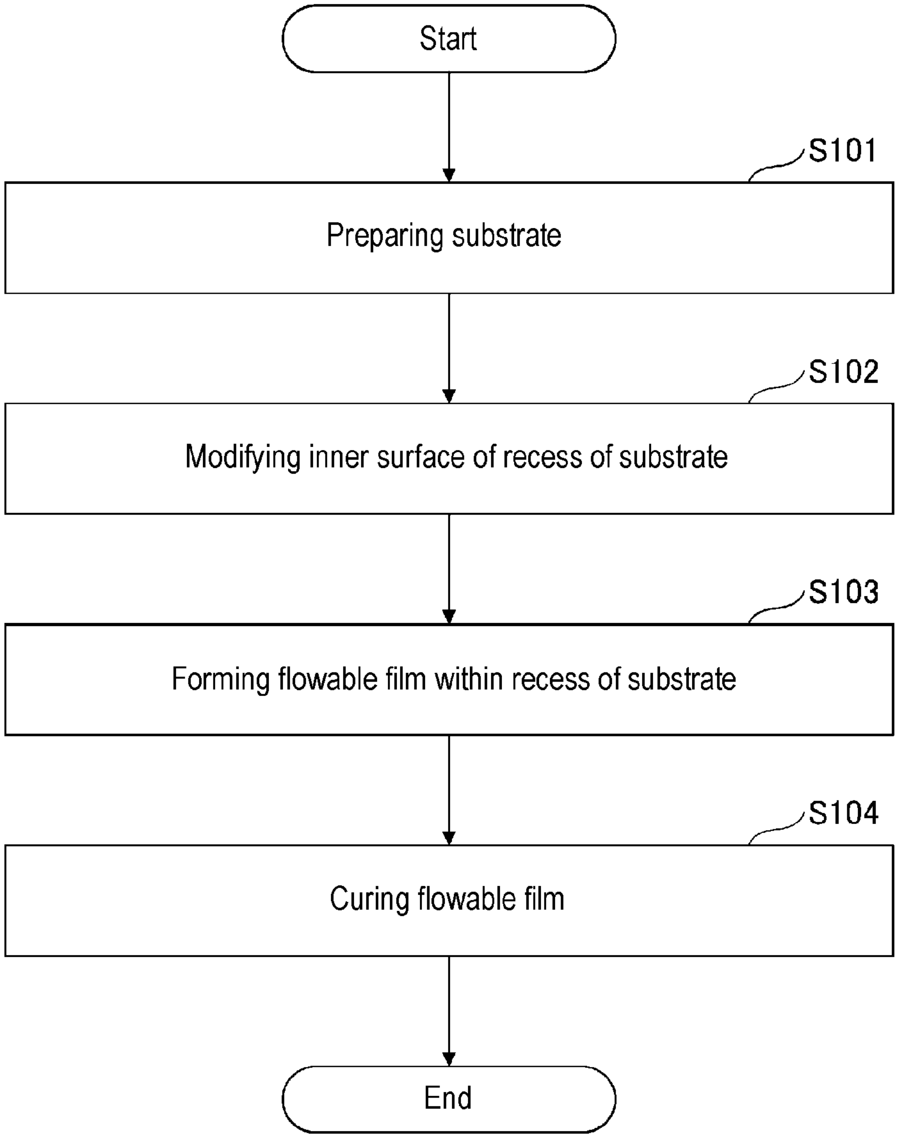
FIG. 2 is an example flowchart illustrating a substrate processing method according to an embodiment of the present disclosure.

Next, an example of a substrate processing method of forming a film on the substrate W will be described with reference to FIG. 2. FIG. 2 is an example flowchart illustrating a substrate processing method according to an embodiment of the present disclosure.

In step S101, the controller 100 prepares the substrate W. The controller 100 controls the gate valve 26, a transfer device (not illustrated) that transfers the substrate W, and the lifting mechanism 44 to transfer the substrate W from the transfer port 25 into the processing container 2 and then place the substrate W on the stage 3. Once the transfer device (not illustrated) has retreated from the transfer port 25, the controller 100 closes the gate valve 26.

Here, a film in which a first element and a second element bond to each other is formed on a surface of the substrate W. In the following description, the first element is Si, the second element is O, and the film formed on the surface of the substrate W is a $SiO_2$ film. Further, recesses such as holes and trenches are formed on the surface ($SiO_2$ film) of the substrate W.

In step S102, a processing of modifying an inner surface of the recess of the substrate W is performed. Here, the inner surface of the recess of the substrate W is modified by generating an active species of a first processing gas in the processing container 2 and exposing the substrate W to the active species.

Specifically, the controller 100 controls the mass flow controller M64 and the valve V64 to supply an Ar gas serving as the first processing gas into the processing container 2. Further, the controller 100 controls the plasma generator 51 to generate an argon plasma between the upper electrode (gas supplier 5) and the lower electrode 33 and to generate an active species (including ions or radicals) of Ar. Alternatively, the controller 100 controls the mass flow controller M63 and the valve V63 to supply a $H_2$ gas serving as the first processing gas into the processing container 2. Further, the controller 100 controls the plasma generator 51 to generate a hydrogen plasma between the upper electrode (gas supplier 5) and the lower electrode 33 and to generate an active species (including ions or radicals) of H.

Exposing the substrate W to the active species breaks the bond between the first element (Si) and the second element (O) on the inner surface of the recess of the substrate W. The second element (O) is then preferentially sputtered from the substrate W. This results in the inner surface of the recess of the substrate W being modified to contain a higher proportion of the first element (Si) after modification compared to before modification. That is, the ratio of the first element (Si) to the second element (O) on the inner surface of the recess after modification is higher than the ratio of the first element (Si) to the second element (O) on the inner surface of the recess before modification. In other words, the inner surface of the recess after modification contains a higher proportion of the first element (Si) compared to before modification.

In step S103, a processing of forming a flowable film in the recess of the substrate W is performed. Here, a second processing gas is supplied into the processing container 2 to form a flowable film in the recess of the substrate W.

Specifically, the controller 100 controls the mass flow controllers M61, M62 and M63 and the valves V61, V62 and V63 to supply a TEOS gas, $SiH_4$ gas and $H_2$ gas, which serve as the second processing gas, into the processing container 2. Further, the controller 100 controls the plasma generator 51 to generate a plasma between the upper electrode (gas supplier 5) and the lower electrode 33. This results in the generation of TEOS and a polymer of TEOS and $SiH_4$ ($Si(OC_2H_5)_x(OSiH_3)_{4-x}$, x=0 to 4) by plasma chemical vapor deposition (CVD). Then, the generated TEOS as well as the polymer of TEOS and $SiH_4$ are cooled on the surface of the substrate W, thereby forming a flowable liquid film. The flowable liquid film then flows into the recess formed on the surface of the substrate W. Thus, the flowable film is formed in the recess of the substrate W.

In step S104, a processing of curing the flowable film is performed. In other words, when the flowable liquid film formed in the recess of the substrate W is subjected to one or more of thermal processing, plasma processing, UV irradiation, and others, the flowable liquid film is cured, resulting in the formation of a solid film in the recess of the substrate W.

In addition, the processing of step S104 may be performed in the substrate processing apparatus 1. Alternatively, there may also be a configuration in which the substrate W with the flowable liquid film formed in the recess is transferred to an apparatus different from the substrate processing apparatus 1, and the processing of step S104 is performed in the different apparatus.

Further, the processing of forming the flowable film as illustrated in step S103 and the processing of curing the flowable film as illustrated in step S104 may be alternately repeated, thereby forming a solid film in the recess of the substrate W. This may prevent the generation of voids in the solid film formed in the recess of the substrate W.

Figure 3:
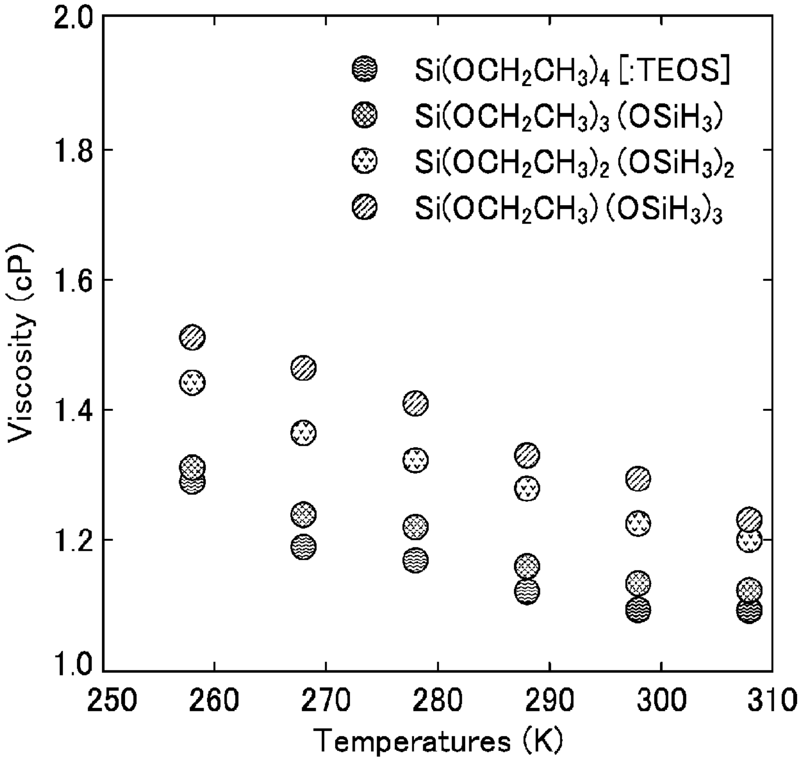
FIG. 3 is an example graph illustrating a relationship between temperatures and viscosity in TEOS and a polymer of TEOS and $SiH_4$.

Next, the flowable film formed in step S103 will be described with reference to FIGS. 3 and 4. FIG. 3 is an example graph illustrating a relationship between temperatures and viscosity in TEOS and a polymer of TEOS and $SiH_4$. In the graph of FIG. 3, the horizontal axis represents temperatures (K), and the vertical axis represents viscosity (cP).

As illustrated in the graph of FIG. 3, TEOS and the polymer of TEOS and $SiH_4$ exhibit an increase in viscosity as the polymerization with $SiH_4$ increases. Further, although not illustrated, TEOS and the polymer of TEOS and $SiH_4$ also exhibit an increase in surface tension as the polymerization with $SiH_4$ increases. Further, TEOS and the polymer of TEOS and $SiH_4$ exhibit an increase in viscosity as the temperature decreases. Further, the higher viscosity of the liquid (TEOS and the polymer of TEOS and $SiH_4$) indicates a tendency for the liquid to solidify as a group of liquid (clustered) on the surface of the substrate W.

Figure 4:
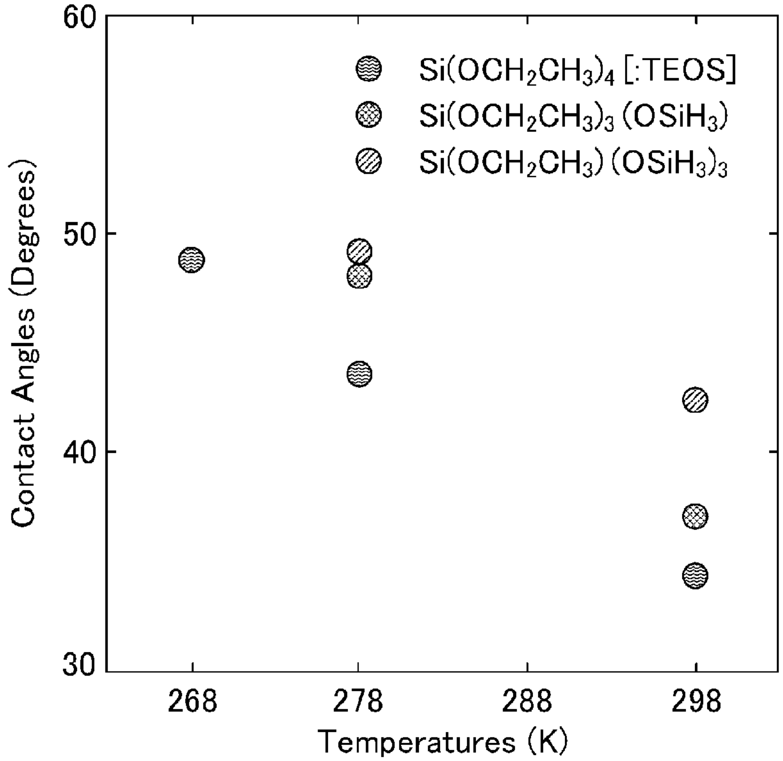
FIG. 4 is an example graph illustrating a relationship between temperatures and contact angles in TEOS and the polymer of TEOS and $SiH_4$.

FIG. 4 is an example graph illustrating a relationship between temperatures and contact angle in TEOS and the polymer of TEOS and $SiH_4$. In the graph of FIG. 4, the horizontal axis represents temperatures (K), and the vertical axis represents the contact angle (degrees) of the liquid (TEOS and the polymer of TEOS and $SiH_4$) on the $SiO_2$ surface.

As illustrated in the graph of FIG. 4, TEOS and the polymer of TEOS and $SiH_4$ exhibit an increase in contact angle on the $SiO_2$ surface as the polymerization with $SiH_4$ increases. Further, TEOS and the polymer of TEOS and $SiH_4$ exhibit an increase in contact angle on the $SiO_2$ surface as the temperature of the substrate decreases. Further, the flowability of the liquid on the surface of the substrate W decreases as the contact angle of the liquid (TEOS and the polymer of TEOS and $SiH_4$) increases.

Figure 5:
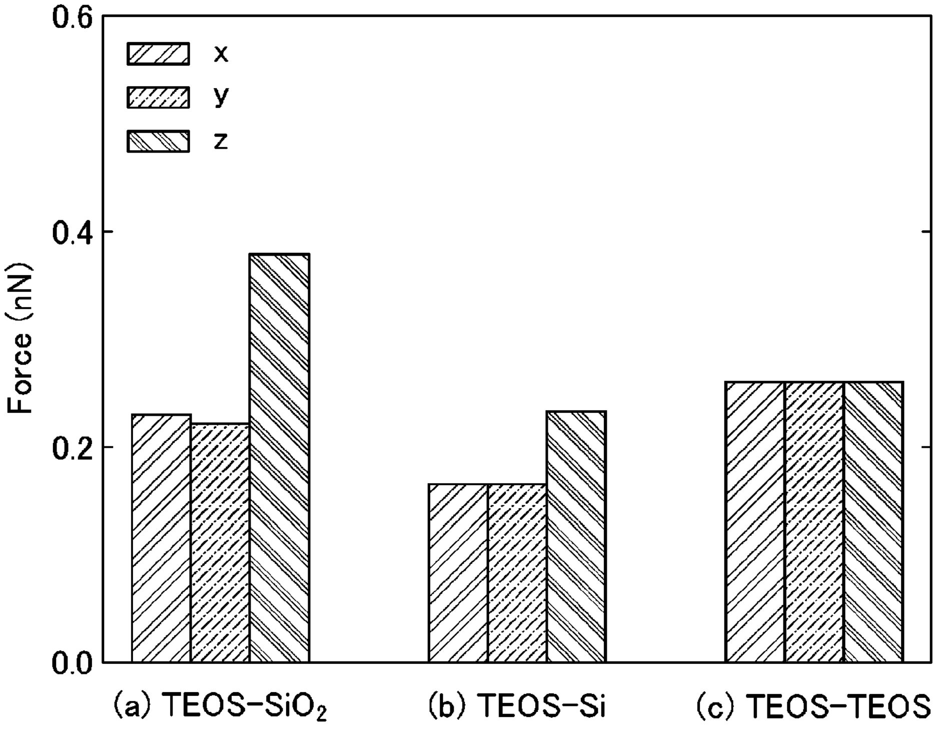
FIG. 5 is a graph illustrating the force acting between a substrate surface and TEOS molecules and the force acting between TEOS molecules.

Next, the force acting between the substrate surface and TEOS molecules (intermolecular force) and the force acting between TEOS molecules (intermolecular force) will be described with reference to FIG. 5. FIG. 5 is a graph illustrating the force acting between the substrate surface and TEOS molecules and the force acting between TEOS molecules.

In FIG. 5, (a) illustrates the force acting on TEOS molecules of the liquid when the substrate surface is $SiO_2$. In FIG. 5, (b) illustrates the force acting on TEOS molecules of the liquid when the substrate surface is Si. In FIG. 5, (c) illustrates the force acting between TEOS molecules. Further, the force acting on TEOS molecules include Coulomb force and van der Waals force. Here, for the substrate surface ($SiO_2$ or Si) and TEOS molecules of the liquid, $F_x$ and $F_y$ indicate the force components in the direction parallel to the substrate surface, and $F_z$ indicates the force component in the direction perpendicular to the substrate surface. In addition, $F_x$, $F_y$ and $F_z$ exhibit the same value between TEOS molecules of the liquid.

Here, the force $F_z$ in the direction perpendicular to the substrate surface between TEOS molecule and $SiO_2$ as illustrated in (a) of FIG. 5 is greater than the force acting between TEOS molecules as illustrated in (c) of FIG. 5.

Figure 6A:
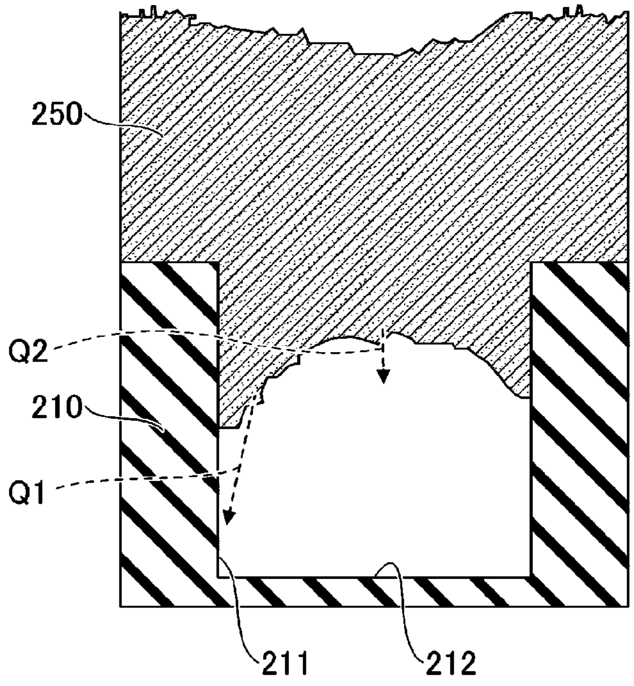
FIG. 6A is an example of simulation results illustrating the flow of a flowable film into a recess when the substrate surface is $SiO_2$.
Figure 6B:
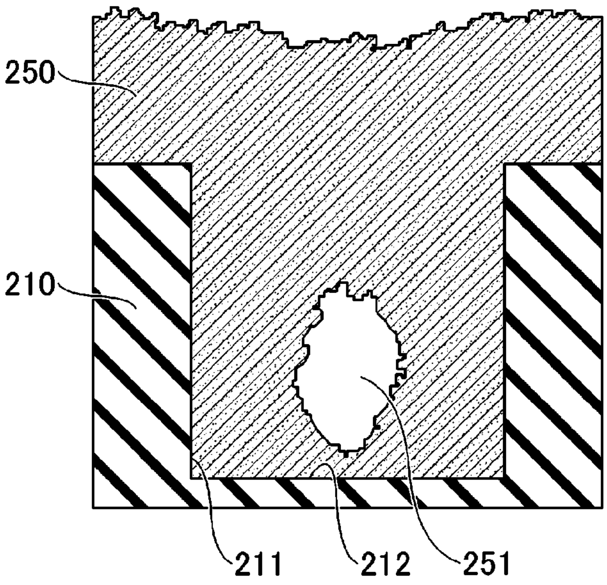
FIG. 6B is an example of simulation results illustrating the flow of the flowable film into the recess when the substrate surface is $SiO_2$.

FIGS. 6A and 6B are examples of simulation results illustrating the flow of a flowable film (TEOS) 250 into the recess when the substrate surface is $SiO_2$. FIG. 6A is a view illustrating the state of the flowable film 250 after a predetermined time has elapsed (2.5 ns) since the flow of the flowable film 250 started. FIG. 6B is a view illustrating the state of the flowable film 250 after the lapse of a further predetermined time (5 ns).

Here, a recess 210 is formed on the substrate surface of $SiO_2$. The recess 210 has a side surface 211 and a bottom surface 212. Here, the force $F_z$ between TEOS molecules and $SiO_2$ (see (a) of FIG. 5) is greater than the force acting between TEOS molecules (see (c) of FIG. 5). Therefore, TEOS molecules in contact with the side surface 211 of $SiO_2$ adsorb to the side surface 211, and TEOS molecules in the vicinity of the side surface 211 of $SiO_2$ are forced toward the side surface 211. Thus, the direction of the flow velocity Q1 of the flowable film 250 in the vicinity of the side surface 211 of $SiO_2$ has a component toward the bottom surface 212 of the recess 210 (downward component as indicated by the arrow in FIG. 6A) and a component toward the side surface 211 of the recess 210 (leftward component as indicated by the arrow in FIG. 6A). In other words, the flow velocity Q1 has an oblique left downward component as a composite component. Further, the flow velocity Q1 of the flowable film 250 in the vicinity of the side surface 211 of $SiO_2$ is faster than the flow velocity Q2 of the flowable film 250 in the center of the recess 210 spaced apart from the side surface 211 and the bottom surface 212 (in FIG. 6A, the flow velocities Q1 and Q2 are indicated by the lengths of the arrows). Therefore, the flowable film 250 flowing into the recess 210 flows along the side surface 211 and the bottom surface 212, which has a risk of generating a void 251 in the flowable film 250 flowing into the recess 210, as illustrated in FIG. 6B.

In contrast, the force $F_z$ in the direction perpendicular to the substrate surface between TEOS molecules and Si, as illustrated in (b) of FIG. 5 is close to the force acting between TEOS molecules as illustrated in (c) of FIG. 5.

Figure 7A:
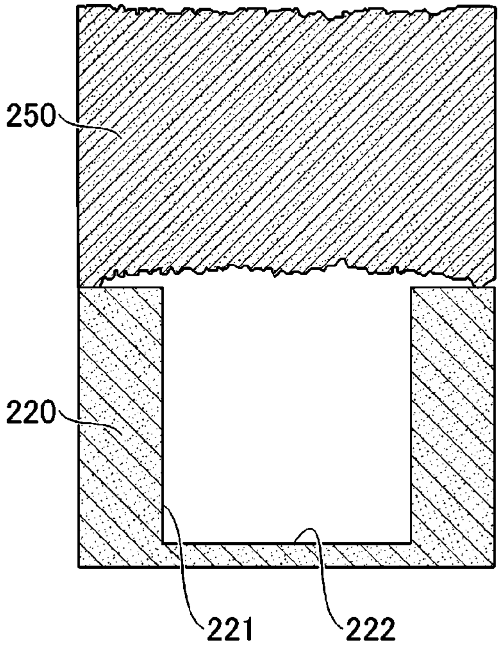
FIG. 7A is an example of simulation results illustrating the flow of the flowable film into the recess when the substrate surface is Si.
Figure 7B:
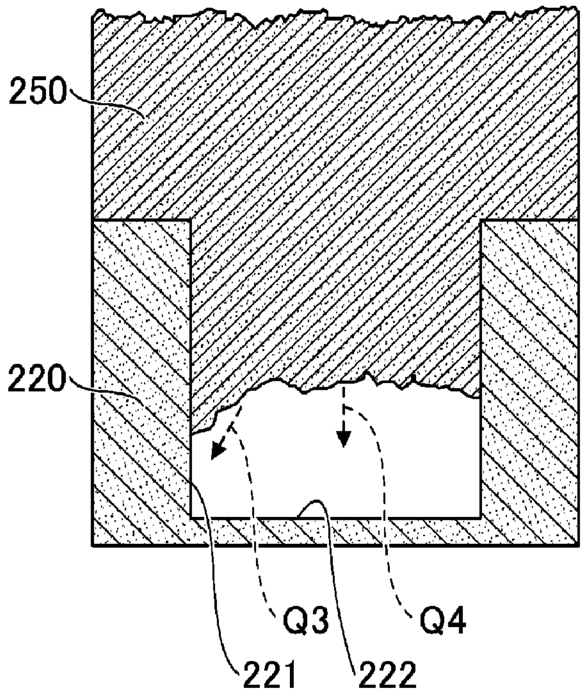
FIG. 7B is an example of simulation results illustrating the flow of the flowable film into the recess when the substrate surface is Si.
Figure 7C:
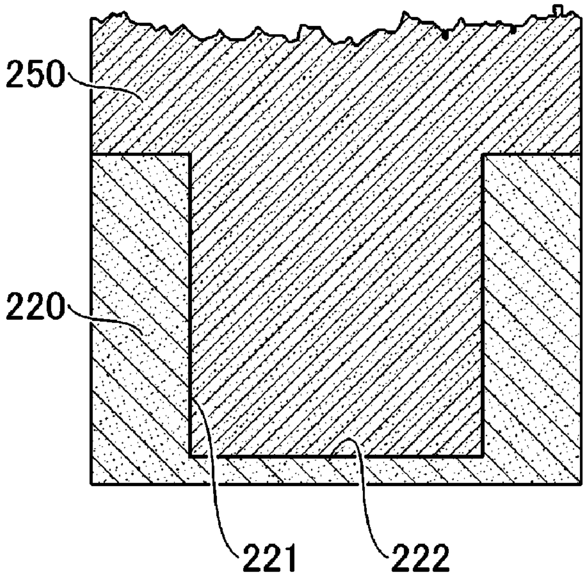
FIG. 7C is an example of simulation results illustrating the flow of the flowable film into the recess when the substrate surface is Si.

FIGS. 7A to 7C are examples of simulation results illustrating the flow of the flowable film (TEOS) 250 into the recess when the substrate surface is Si. FIG. 7A is a view illustrating the state of the flowable film 250 at the start of the flow of the flowable film 250. FIG. 7B is a view illustrating the state of the flowable film 250 after a predetermined time has elapsed (2.5 ns) since the flow of the flowable film 250 started. FIG. 7C is a view illustrating the state of the flowable film 250 after the lapse of a further predetermined time (5 ns).

Here, a recess 220 is formed on the substrate surface of Si. The recess 220 has a side surface 221 and a bottom surface 222. Here, the force $F_z$ between TEOS molecule and Si (see (b) in FIG. 5) is smaller than the force $F_z$ between TEOS molecules and $SiO_2$ (see (a) in FIG. 5) and is close to the force acting between TEOS molecules (see (c) in FIG. 5). Thus, the flow velocity Q3 of the flowable film 250 in the vicinity of the side surface 221 of Si is close to the flow velocity Q4 of the flowable film 250 in the center of the recess 220 spaced apart from the side surface 221 and the bottom surface 222 (in FIG. 7B, the flow velocities Q3 and Q4 are indicated by the lengths of the arrows). Therefore, the flowable film 250 may flow to the bottom surface 222 of the recess 220, thus preventing the generation of voids, as illustrated by the time lapse of FIGS. 7A to 7C.

In this way, through the transition of the surface of the recess from $SiO_2$ (see FIGS. 6A and 6B) to Si (see FIGS. 7A to 7C), the vertical force $F_z$ between TEOS molecules and the substrate surface may be reduced (see FIG. 5), which may prevent the generation of voids when the flowable film (TEOS) 250 flows into the recess. In addition, a case where TEOS is used as the flowable film 250 has been illustrated in FIGS. 5 to 7C by way of example, but the same applies to the polymer of TEOS and $SiH_4$.

Next, the processing of modifying the inner surface of the recess of the substrate W in step S102 will be described with reference to FIGS. 8A, 8B, 9A and 9B.

Figure 8A:
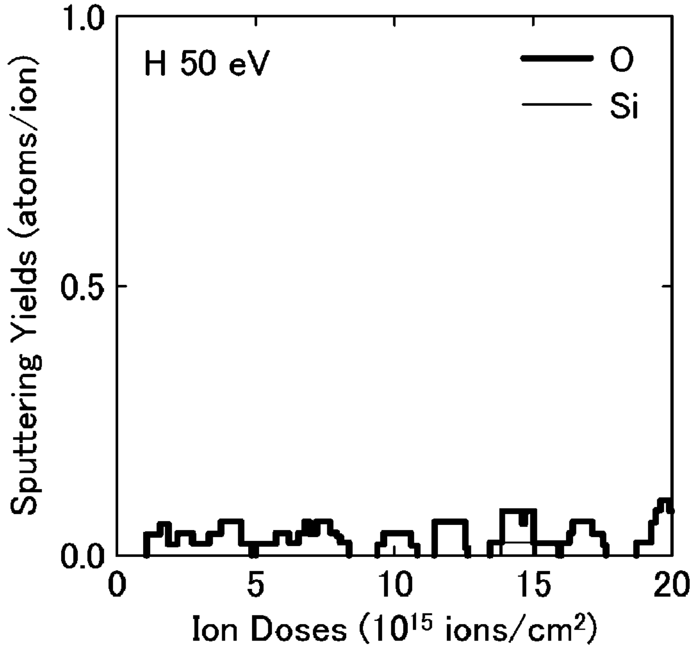
FIG. 8A is an example graph illustrating atoms sputtered from a substrate W when a $SiO_2$ substrate is irradiated with an active species.
Figure 8B:
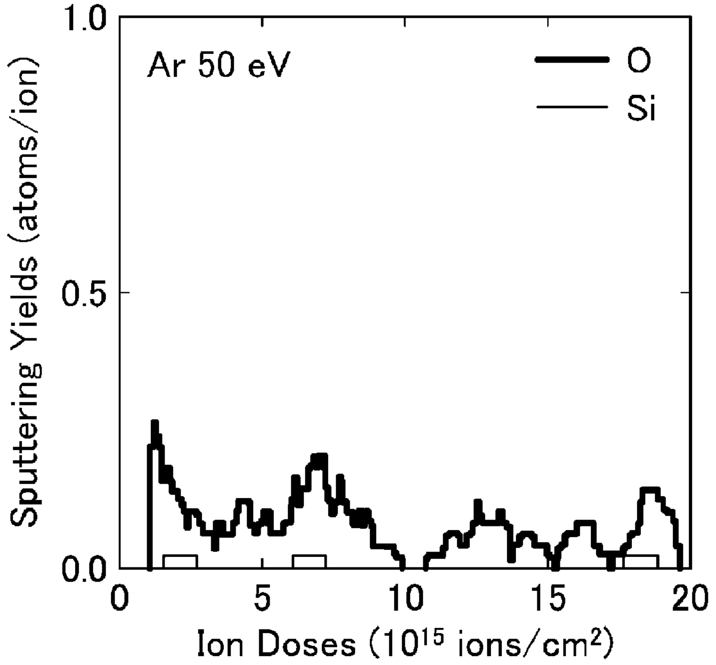
FIG. 8B is an example graph illustrating atoms sputtered from the substrate W when the $SiO_2$ substrate is irradiated with an active species.

FIGS. 8A and 8B are example graphs illustrating atoms sputtered from the substrate when the $SiO_2$ substrate is irradiated with an active species. FIG. 8A illustrates a case where hydrogen ions with an incident energy (IEDF: Ion Energy Distribution Functions) of 50 eV are irradiated as an active species. FIG. 8B illustrates a case where argon ions with an incident energy of 50 eV are irradiated as an active species. In FIGS. 8A and 8B, the horizontal axis represents ion doses, and the vertical axis represents the amount of sputtered atoms. Further, O is indicated by a thick solid line, and Si is indicated by a thin solid line.

As illustrated in FIG. 8A, the collision of hydrogen ions against the $SiO_2$ substrate shows that O atoms are preferentially sputtered. Further, as illustrated in FIG. 8B, the collision of argon ions against the $SiO_2$ substrate shows that O atoms are preferentially sputtered.

Figure 9A:
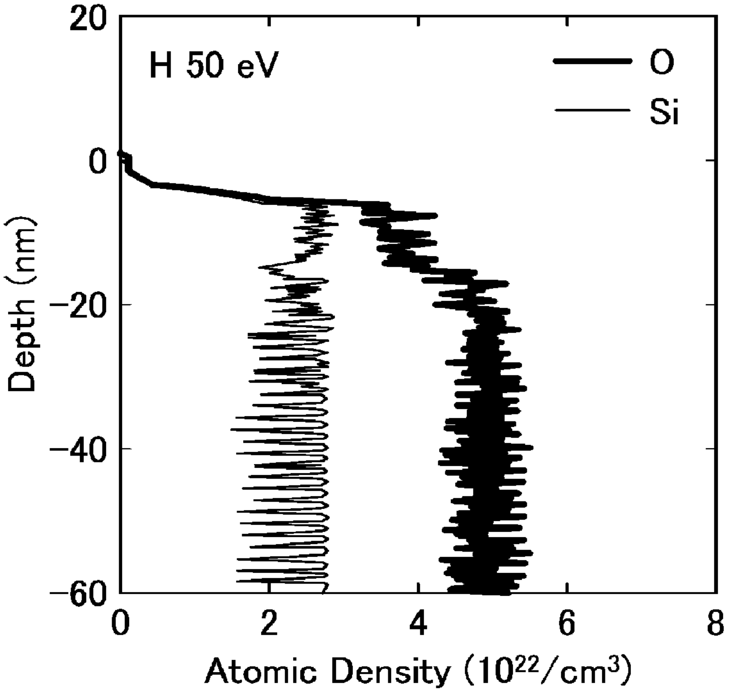
FIG. 9A is an example graph illustrating the depth-directional profile of the substrate after the irradiation of an active species.
Figure 9B:
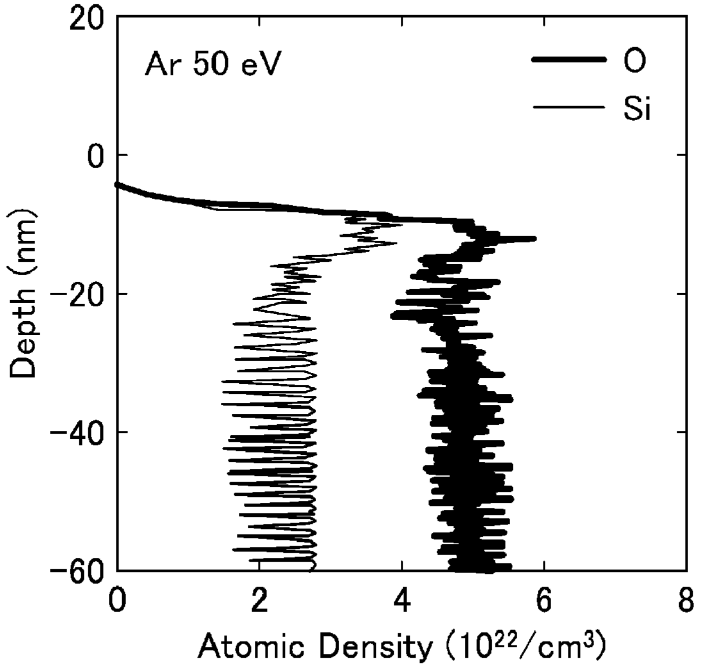
FIG. 9B is an example graph illustrating the depth-directional profile of the substrate after the irradiation of an active species.

The substrate after the processing illustrated in FIGS. 8A and 8B will be further described with reference to FIGS. 9A and 9B. FIGS. 9A and 9B are example graphs illustrating the depth directional profile of the substrate after the irradiation of an active species. FIG. 9A illustrates a case where the $SiO_2$ substrate is irradiated with hydrogen ions with an incident energy of 50 eV as an active species. FIG. 9B illustrates a case where the $SiO_2$ substrate is irradiated with argon ions with an incident energy of 50 eV as an active species. In FIGS. 9A and 9B, the vertical axis represents the depth from the substrate surface, and the horizontal axis represents the atomic density. Further, O is indicated by a thick solid line, and Si is indicated by a thin solid line.

As illustrated in FIG. 9A, the $SiO_2$ substrate that has been modified with hydrogen ions as an active species exhibits a state where the near-surface region has a higher proportion of Si atoms (Si-rich) compared to O atoms. Further, as illustrated in FIG. 9B, the $SiO_2$ substrate that has been modified with argon ions as an active species exhibits a state where the near-surface region has a higher proportion of Si atoms (Si-rich) compared to O atoms.

In this way, the processing of modifying the inner surface of the recess of the substrate W in step S102 may make the inner surface of the recess of the substrate W have a high proportion of Si (Si-rich). This may reduce the vertical force $F_z$ acting between the substrate surface (side surface of the recess) and TEOS molecules, as contrasted in (a) and (b) in FIG. 5. In other words, it is possible to transition the inner surface of the recess from the state of $SiO_2$ (see FIGS. 6A and 6B) to the state of Si (see FIGS. 7A to 7C). This allows the flowable film to flow to the bottom surface of the recess, thereby preventing the generation of voids upon the processing of forming the flowable film in the recess of the substrate W in step S103.

In addition, setting the incident energy to 50 eV or higher ensures that the bond between Si and O is appropriately broken, leading to a high proportion of Si (Si-rich) on the substrate surface. Further, if the incident energy increases, the substrate surface is sputtered and hydrogen or argon remains in the vicinity of the substrate surface, causing damage to the substrate. Therefore, the incident energy may be 100 eV or lower.

Further, if the ion irradiation time (the time to expose the substrate W to the plasma in step S102, the ion doses in FIGS. 8A and 8B) increases, the substrate surface with a higher proportion of Si (Si-rich) is further continuously irradiated with ions. Therefore, the sputtered O atoms decrease in the state of a high proportion of Si after the lapse of irradiation time compared to the initial state where $SiO_2$ is irradiated with ions, which results in a steady-state sputtering yield. Further, the sputtered Si atoms increase in the state of a high proportion of Si after the lapse of irradiation time compared to the initial state where $SiO_2$ is irradiated with ions, which results in a steady-state sputtering yield. Therefore, by controlling the time to expose the substrate W to the plasma in step S102, the substrate surface (inner surface of the recess) may be appropriately brought into the state with a high proportion of Si (Si-rich). Therefore, the irradiation of ions may be several times (e.g., 10 times) the atomic density of the outermost surface.

In addition, the active species used to modify the inner surface of the recess of the substrate W into the state of a high proportion of Si (Si-rich) have been described as being hydrogen ions and argon ions by way of example, but are not limited to these. The active species may include ions or radicals. Further, the first processing gas is not limited to the hydrogen gas or argon gas. The first processing gas may include one or more of an inert gas such as a noble gas and a gas containing hydrogen atoms.

Further, the surface of the substrate W on which the recess is formed has been described as $SiO_2$ containing the bond between Si (first element) and O (second element), but is not limited to this. The second element may include one or more of oxygen (O), nitrogen (N), and carbon (C). For example, the substrate surface on which the recess is formed may be $SiO_2$, SiOC, SiCN, or the like.

Further, the first element may include one or more of metal atoms such as Ti, Al, and Ta. The second element may include one or more of oxygen (O), nitrogen (N), or carbon (C).

For example, when performing the processing of modifying the inner surface of the recess of the substrate W in step S102 on a metal oxide film with a recess, it is possible to break the bonds between metal atoms and oxygen atoms, resulting in the inner surface of the recess with a high proportion of metal atoms. This reduces the amount of a polar metal oxide on the substrate surface, leading to a decrease in Coulomb force acting between the substrate surface and TEOS molecules. Accordingly, it is possible to reduce the vertical force $F_z$ acting between the substrate surface and TEOS molecule. Thus, the flow velocity of the flowable film in the vicinity of the side surface of the recess and the flow velocity of the flowable film in the center of the recess may be made close to each other. Therefore, the flowable film may flow to the bottom surface of the recess, thereby preventing the generation of voids.

Although embodiments of a plasma processing system have been described above, the present disclosure is not limited to the above-described embodiments, and various modifications and improvements are possible within the scope of the gist of the present disclosure described in the claims.

Further, this application claims the priority based on Japanese Patent Application No. 2021-134266 filed on Aug. 19, 2021, and the entire content of this Japanese patent application is incorporated herein by reference.

EXPLANATION OF REFERENCE NUMERALS

1: substrate processing apparatus, 2: processing container, 3: stage, 5: gas supplier, 6: gas supply path, 100: controller, 101: storage, 210, 220: recess, 211, 221: side surface, 212, 222: bottom surface, 250: flowable film, 251: void

What is claimed is:

1. A substrate processing method of forming a film on a substrate that contains a bond between a first element and a second element and has a recess, the substrate processing method comprising:

preparing the substrate;

modifying a surface in the recess by generating an active species of a first processing gas and exposing the substrate to the active species; and forming a flowable film in the recess, wherein a ratio of the first element to the second element in the surface in the recess after the modifying the surface in the recess is higher than a ratio of the first element to the second element on the surface in the recess before the modifying the surface in the recess, wherein the modifying the surface in the recess includes modifying a side surface in the recess so as to reduce a magnitude of a force perpendicular to the side surface acting between the side surface and molecules of the flowable film, and wherein the forming the flowable film in the recess includes supplying a second processing gas to form the flowable film and flowing the flowable film into the recess of the substrate.

2. The substrate processing method of claim 1, wherein the active species includes ions or radicals of the first processing gas.

3. The substrate processing method of claim 2, wherein the modifying the surface in the recess includes breaking the bond between the first element and the second element with the active species.

4. The substrate processing method of claim 3, wherein the modifying the surface in the recess includes sputtering the second element with the active species.

5. The substrate processing method of claim 4, wherein the first element includes one of Si, Ti, Al, or Ta, and the second element includes one or more of O, N, or C.

6. The substrate processing method of claim 4, wherein a surface of the substrate having the recess is made of $SiO_2$.

7. The substrate processing method of claim 4, wherein the first processing gas includes one or more of an inert gas or a gas containing hydrogen atoms.

8. The substrate processing method of claim 4, further comprising curing the flowable film.

9. The substrate processing method of claim 8, wherein the forming the flowable film in the recess and curing the flowable film are alternately repeated, such that a film obtained by curing the flowable film is formed in the recess.

10. The substrate processing method of claim 1, wherein the first element includes one of Si, Ti, Al, or Ta, and the second element includes one or more of O, N, or C.

11. The substrate processing method of claim 1, wherein a surface of the substrate having the recess is made of $SiO_2$.

12. The substrate processing method of claim 1, wherein the first processing gas includes one or more of an inert gas or a gas containing hydrogen atoms.

13. The substrate processing method of claim 1, further comprising curing the flowable film.

14. The substrate processing method of claim 13, wherein the forming the flowable film in the recess and curing the flowable film are alternately repeated, such that a film obtained by curing the flowable film is formed in the recess.

* * * * *